United States Patent
Kumar et al.

(10) Patent No.: US 9,618,965 B2
(45) Date of Patent: Apr. 11, 2017

(54) DYNAMIC CALIBRATION OF DATA PATTERNS

(71) Applicant: Tektronix, Inc., Beaverton, OR (US)

(72) Inventors: Ganesh K. Kumar, Bangalore (IN); Krishna N H Sri, Bangalore (IN); Madhusudhan Acharya, Bangalore (IN); Kamlesh Mishra, Bangalore (IN)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 14/814,137

(22) Filed: Jul. 30, 2015

(65) Prior Publication Data

US 2016/0334833 A1 Nov. 17, 2016

(30) Foreign Application Priority Data

May 15, 2015 (IN) .......................... 1920/MUM/2015

(51) Int. Cl.
*G06F 1/10* (2006.01)
*G06F 1/04* (2006.01)
*H03K 5/135* (2006.01)

(52) U.S. Cl.
CPC ...................................... *G06F 1/10* (2013.01)

(58) Field of Classification Search
USPC .................................................. 327/100–333
See application file for complete search history.

(56) References Cited

U.S. PATENT DOCUMENTS

| | | | | |
|---|---|---|---|---|
| 6,100,724 A | * | 8/2000 | Yoshimura | G11B 20/1403 327/100 |
| 2004/0086069 A1 | * | 5/2004 | Engel | H04L 7/033 375/371 |
| 2008/0298801 A1 | * | 12/2008 | King | G01M 11/33 398/26 |
| 2008/0315617 A1 | * | 12/2008 | Kracht | B60J 7/201 296/108 |
| 2011/0296353 A1 | * | 12/2011 | Ahmed | G06F 3/017 715/848 |

\* cited by examiner

*Primary Examiner* — Brandon S Cole
(74) *Attorney, Agent, or Firm* — Michael A. Nelson; Kevin D. Dothager; Marger Johnson

(57) ABSTRACT

A system for dynamically calibrating operational parameters of a Device Under Test (DUT) includes a signal generator for generating a data pattern, a DUT structured to generate a clock signal, an oscilloscope structured to measure margins of the generated clock signal compared to an eye-diagram produced on the oscilloscope from the data pattern, and a calibration unit. The calibration unit can produce a candidate a jitter value for the signal generator, receive a determination from the oscilloscope whether the data pattern generated with the candidate jitter value causes the DUT to produce the generated clock signal within a pre-determined tolerance level, and modify the jitter value accordingly. The calibration unit may also be further structured to generate voltage swing values.

20 Claims, 8 Drawing Sheets

DYNAMIC CALIBRATION OF DATA PATTERNS

CROSS-REFERENCE TO RELATED APPLICATIONS

This application claims priority to Indian Patent Application 1920/MUM/2015, filed May 15, 2015, entitled DYNAMIC CALIBRATION OF DATA PATTERNS WITH RESPECT TO DUT CLOCK, the contents of which are herein incorporated by reference.

FIELD OF INVENTION

This disclosure generally relates to calibration and, more particularly, relates to methods and systems for dynamic calibration of data patterns.

BACKGROUND

Signal generators are well known in the art. Calibrations like a jitter calibration are available on signal generators such as a Bit Error Rate Analyzer or on an arbitrary signal/waveform generator (AWG). Typically, these signal generators are general-purpose and calibrate a given signal of interest. Typically, two parameters, Jitter and Swing, are calibrated at a time by trial and error. In a typical calibration, the pattern gets calibrated for expected jitter and swing values. This calibration method is used for particular data connections such as the Mobile High-Definition Link technologies, (such as MHL3.2) and High-Definition Multimedia Interface technologies (such as HDMI1.4/2.0).

The existing calibration procedures are done manually, which is time consuming and error prone. Also, there is no easy way for the oscilloscope to seamlessly tie an application and its calibration requirements.

Embodiments of the invention address these and other limitations of the prior art.

SUMMARY OF THE INVENTION

Aspects of the invention include a system for dynamically calibrating operational parameters of a Device Under Test (DUT) coupled to a test and measurement system that includes a signal generator structured to generate a data pattern, a DUT structured to generate a clock signal, an oscilloscope coupled to the signal generator and to the DUT and structured to measure margins of the generated clock signal compared to an eye-diagram produced on the oscilloscope from the data pattern, and a calibration unit. In some embodiments the calibration unit is coupled to the signal generator and to the oscilloscope, and structured to produce a candidate a jitter value for the signal generator. The calibration unit is also structured to receive a determination from the oscilloscope whether the data pattern generated with the candidate jitter value causes the DUT to produce the generated clock signal within a pre-determined tolerance level from a measured eye width of the eye-diagram generated by the oscilloscope from the data pattern. The calibration unit may also be further structured to generate a candidate voltage swing value, send the candidate voltage swing value to the signal generator, and receive a determination from the oscilloscope whether the candidate voltage swing value causes the DUT to produce the generated clock signal within the pre-determined tolerance level from the measured eye width of the eye-diagram generated by the oscilloscope from the data pattern.

Aspects of the invention also include associated methods.

BRIEF DESCRIPTION OF THE DRAWINGS

Reference is made to embodiments of the invention, examples of which may be illustrated in the accompanying figures. These figures are intended to be illustrative, not limiting. Although the invention is described in the context of these embodiments, it should be understood that this description is not intended to limit the scope of the invention to these particular embodiments.

DETAILED DESCRIPTION OF THE INVENTION

The embodiments herein provide method and system for dynamic calibration of data patterns. References in the specification to "one embodiment" or "an embodiment" means that a particular feature, structure, characteristic, or function described in connection with the embodiment is included in at least one embodiment of the invention. The appearances of the phrase "in one embodiment" in various places in the specification are not necessarily all referring to the same embodiment. Embodiments of the invention are described herein using specific exemplary details for better understanding. However, the invention disclosed can be implemented by a person skilled in the art without the use of these specific details. Embodiments of the invention may be implemented in hardware, such as an Application Specific Integrated Circuit (ASIC), a Field Programmable Gate Array (FPGA), or with computer software operating in conjunction with a general purpose computer, a specific purpose computer, or a combination of such examples. Components and devices shown in block diagram are illustrative of exemplary embodiments of the invention and are meant to avoid obscuring the invention. Also, the connections between various elements may not necessarily be direct and the data transfer in between can be subjected to modifications.

In some embodiments a method for dynamic calibration is performed on an output of a Device Under Test (DUT) which is given as reference input to a signal generator. The signal generator can be any signal generator like an arbitrary waveform generator (AWG) which generates backward data patterns to be used as input for the DUT. The data pattern is calibrated with respect to a forward clock signal generated by the source DUT. The Source Forward Clock may be referred to in some examples as eCBUS FWD and the data pattern (like a data pattern from an AWG) may be referred to as eCBUS BWD data. The calibrated pattern from the AWG is provided back as an input to the DUT to check for Bit Error Rate (BER) values.

In an embodiment, a hybrid method of the present invention calibrates to meet marginal EYE opening through software running on an oscilloscope for determining that calibration is completed, and not merely calibrated with a scalar value. So, the data pattern, for example the AWG pattern, is adjusted by adding more periodic jitter and voltage swing based on the DUT output.

Figure 1:
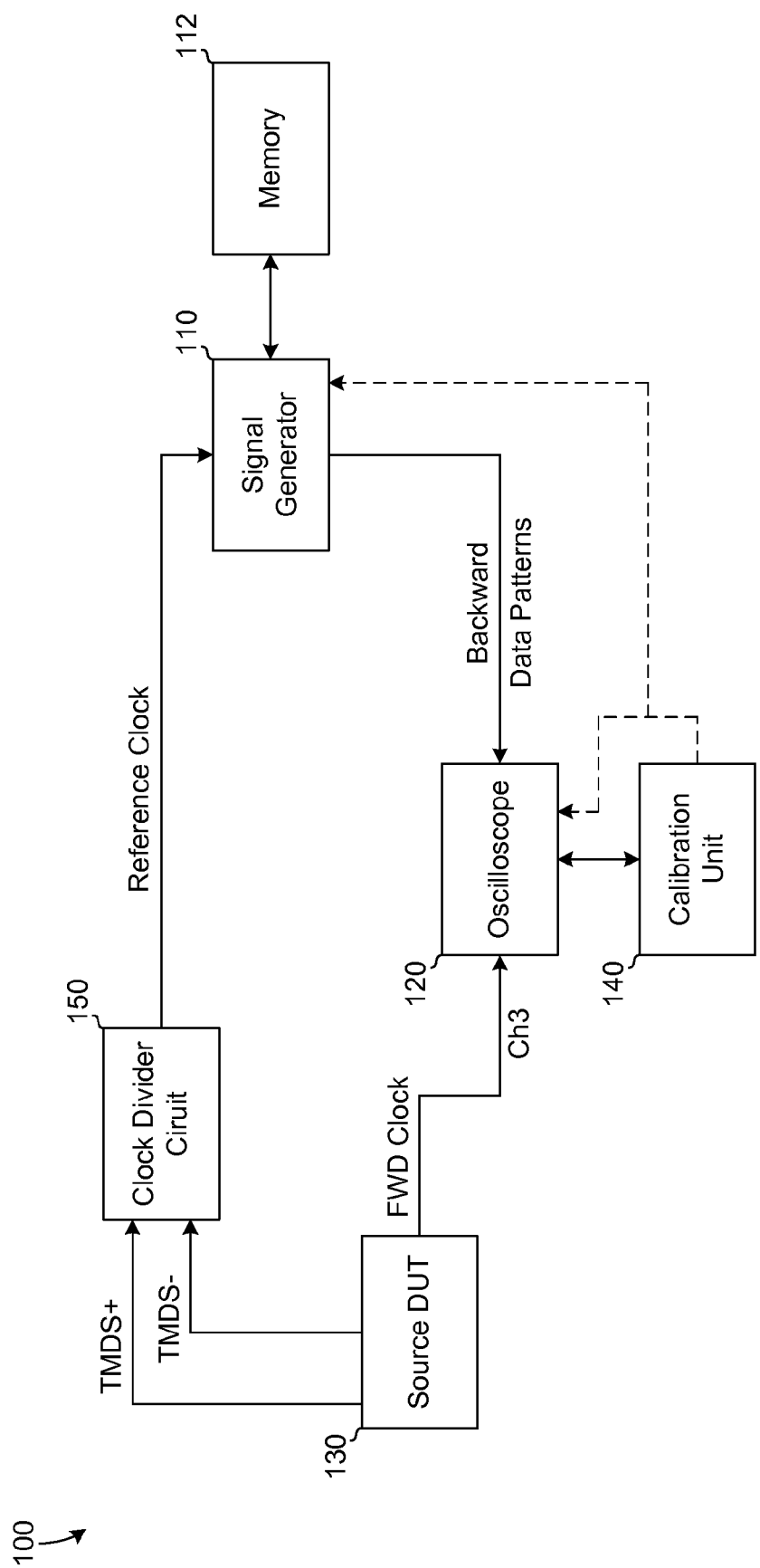
FIG. 1 is a block diagram illustrating connections for calibration according to embodiments of the invention.

A calibration system 100 according to embodiments of the invention is illustrated with a calibration connection diagram as shown in FIG. 1. The calibration system 100 includes a signal generator 110 connected to an oscilloscope 120. The signal generator 110 generates data patterns, such as backward data patterns, for passing through the oscilloscope 120 to a source DUT (Device Under Test) 130. The DUT 130 is configured to generate a forward clock (such as an eCBUS FWD CLK) and send it to the oscilloscope 120. The source DUT 130 also receives the backward data patterns from the signal generator 110 through the oscilloscope. The calibration system 100 further includes a calibration unit 140 for determining how much to calibrate, adding periodic jitter Pj and adjusting swing voltage.

For the purpose of explanation, embodiments of the invention are described with reference to the signal generator 110 as an arbitrary waveform generator (AWG). However, a person ordinarily skilled in the art would appreciate that the signal generator may be any signal generator other than AWG also. The signal generator 110 is coupled to a memory 112 for storing calibrated patterns.

Embodiments of the invention calibrate periodic jitter on the backward data patterns, such as eCBUS BWD data, and voltage swing, to meet marginal EYE requirements. Additionally embodiments determine the jitter tolerance of the backward data. This confirms that the source DUT 130 tolerates the maximum jitter of the backward data specified by test specifications for certain protocols, such as the MHL compliance test specification.

In some embodiments two clock periodic jitter components are provided at 10 MHz and 7 MHz, and two data jitter components are provided at 1 MHz and 500 kHz. The system illustrated in FIG. 1 can calibrate eCBUS-S BWD patterns for 1 MHz and 500 KHz jitter components separately, which accounts for the source DUT CK jitter, and this is achieved by performing dynamic calibration. Performing such a dynamic calibration is preferred because the DUT can have more or less jitter depending on the DUT and then the data pattern (like AWG pattern) can get adjusted for these values.

As illustrated in FIG. 1, an external clock divider circuit CLK 150 is positioned to scale a signal from the DUT, such as a resultant AVLINK or TMDS data output to one that may be accepted by an external clock input range of the signal generator 110. The clock divider circuit 150 converts the higher frequency signals from the DUT output to an input range between 10 MHZ to 800 MHZ, using a variable divider. The received reference clock input is then used in the PLL circuit of an internal clock oscillator within the signal generator 110. Therefore, the external reference clock signal and 'Variable' type is used to adjust the signal generator frequency to the external clock that originates with the source DUT 130. In embodiments where the clock input range of the signal generator 110 matches an output clock of the DUT 130, the clock divider circuit 150 would not be necessary.

The signal generator 110 is made to be synchronous with the source DUT 130 by applying an external REF CK input from the external clock divider 150, and a hardware Phase Locked Loop (PLL) in the signal generator 110 locks to this and generates calibrated patterns based on the received reference clock.

In an embodiment, a calibrator 140 sequentially calibrates jitter components. For example first a 1 MHz jitter may be calibrated, followed by 500 kHz jitter. Next, error patterns are calibrated at 1 MHz and 500 KHz from the signal generator 110 output. The calibrator 140 performs swing calibration and computes the AWG gain, and then adjusts the jitter amount until it passes an eCBUS-D BWD Data with clean (i.e., non-interfering) margins, as described in more detail below.

When the calibration is to begin, first a relatively accurate initial periodic jitter value is selected. The initial value determines the number of iterations that will be needed to satisfy the marginal eye diagram test that is performed by the oscilloscope 120 based on the output of the DUT 130 and backward data patterns from the AWG.

As experimentally determined, having a 1 Unit Interval (UI) is an optimal initial value for an initial jitter value Pj at 1 MHz and 500 KHz for the system described in FIG. 1. However, embodiments of the invention can also be used to perform a 3-point calibration to arrive an estimated value.

Figure 2A:
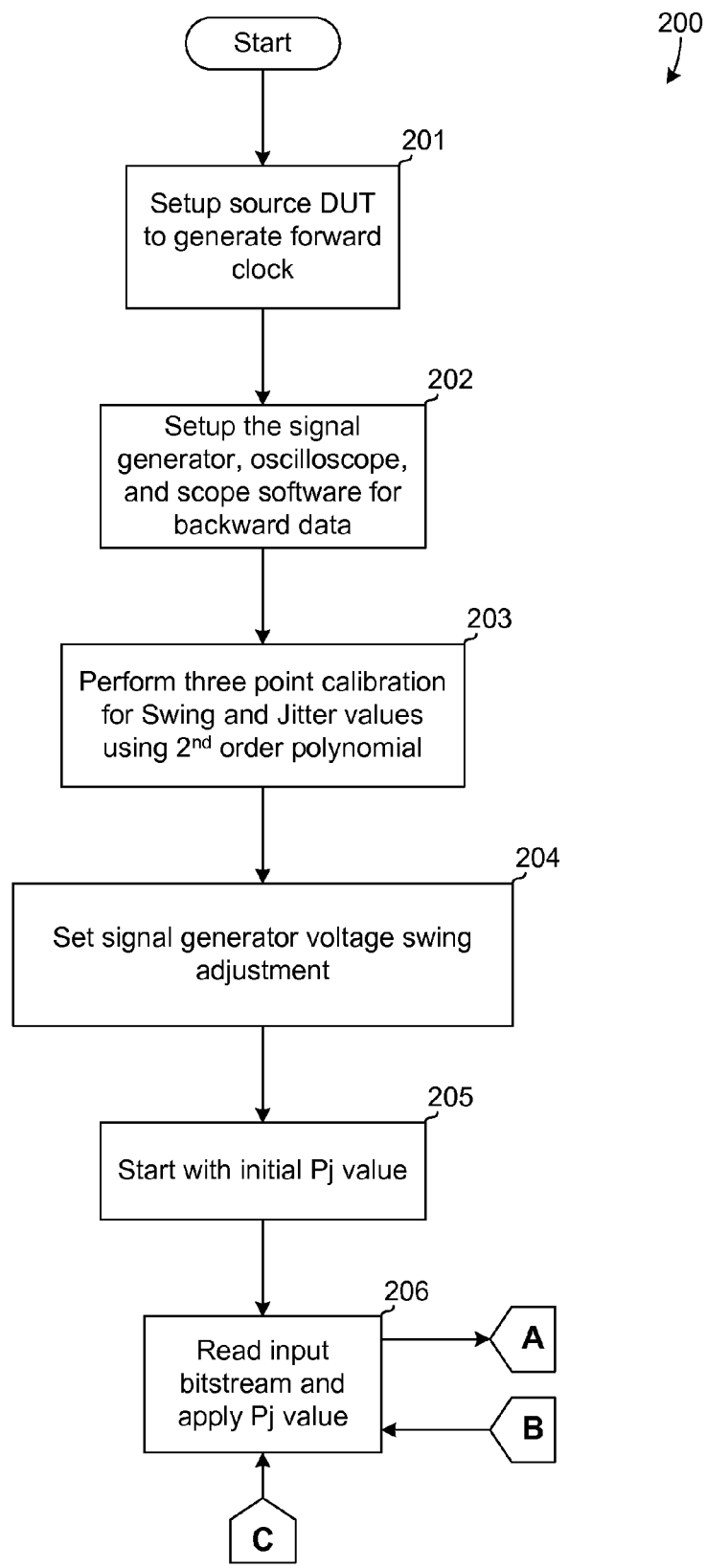
FIG. 2, which is illustrated on FIGS. 2A, 2B, and 2C, is an example flow diagram illustrating operations of a hybrid method for calibration of data patterns in accordance with embodiments of the invention.
Figure 2B:
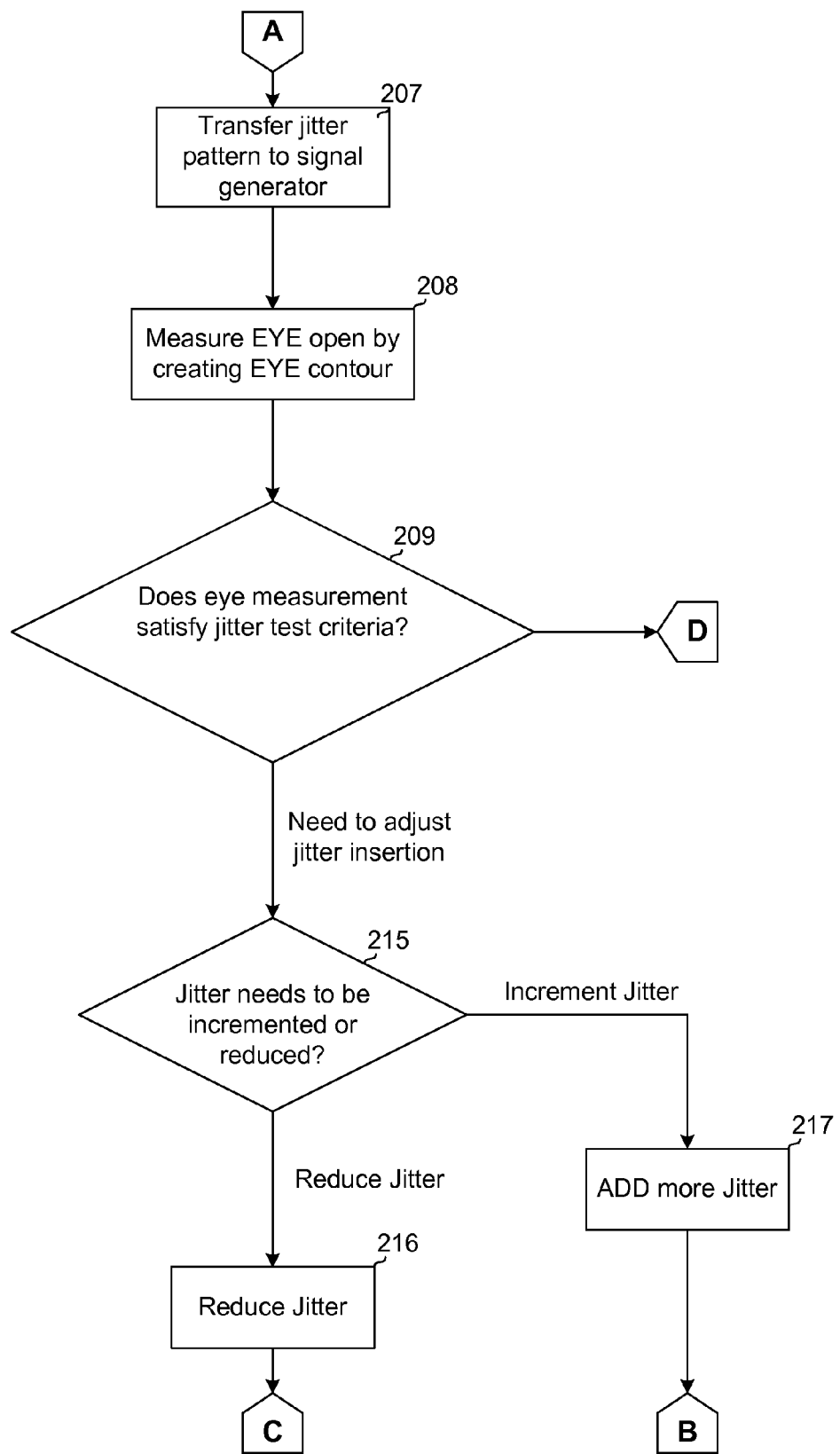
Figure 2C:
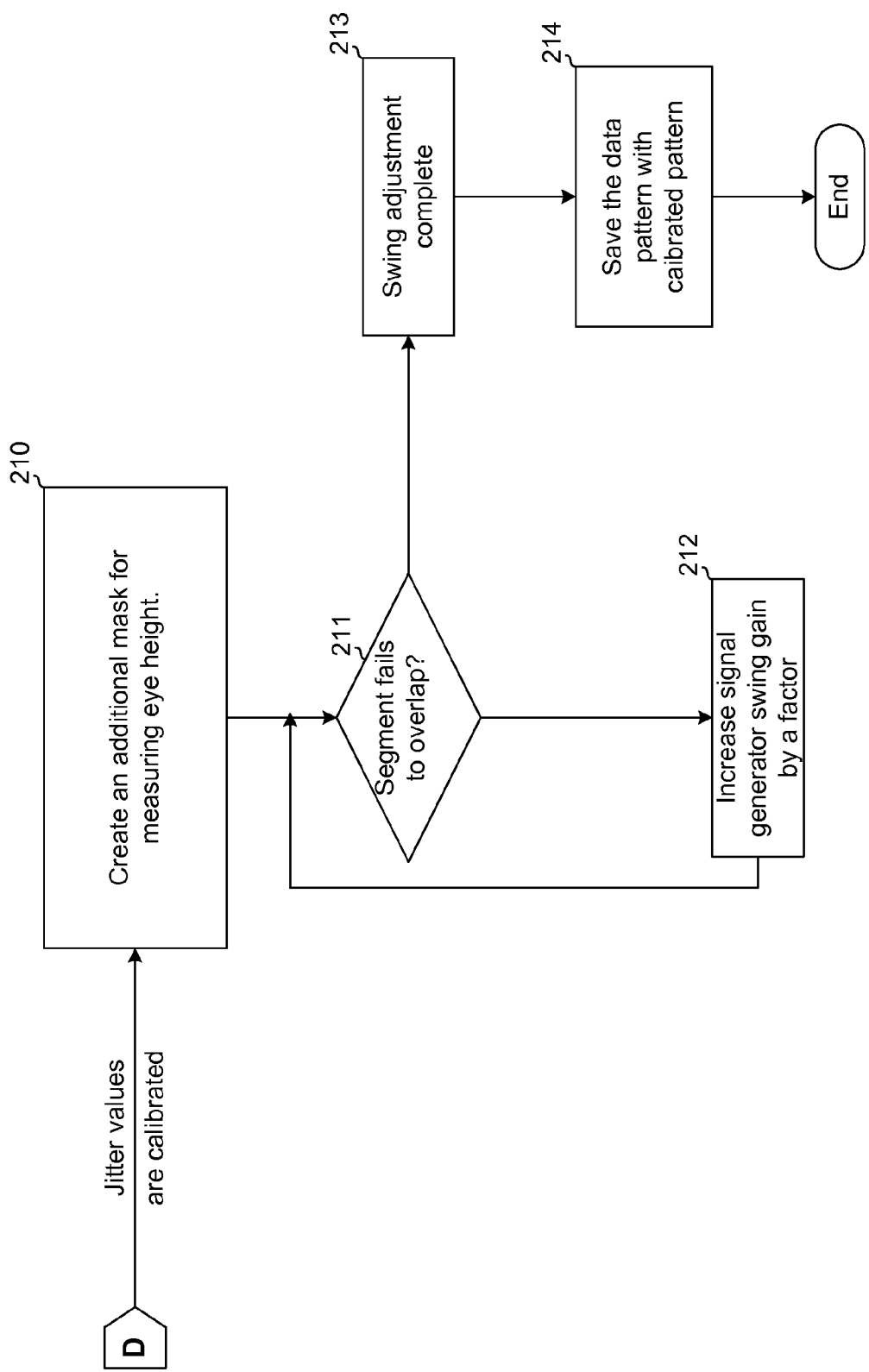

Referring to FIGS. 2A, 2B, and 2C, a flow diagram depicting a hybrid method for calibration of data patterns is provided in accordance with an embodiment of the present invention. The method begins with an operation of 201 for setting up the source DUT 130 for generating a forward clock, such as the previously mentioned eCBUS FWD CLK. In operation 202, the signal generator 110 is set up to generate backward data, such as the previously mentioned eCBUS BWD data. Also in operation 202 the oscilloscope and its software are set up for making advanced automated jitter, eye-diagram and timing measurements. The software for making such measurements may be, for example, DPO-JET software available from Tektronix, Inc. of Beaverton Oreg.

In operation 203, a 3-point calibration for swing and jitter values is performed using a second order polynomial, as described in more detail below. In some embodiments merely an estimated initial jitter may be used, without performing the 3-point calibration, but the dynamic calibration may take more cycles to complete.

In operation 204, the signal generator swing adjustment is set as, for example, 150 mV mask height+75 mV for signal path loss and 50 mV to meet rise time after adding the jitter value. In operation 205, the initial Pj value is set, starting with, for example an initial Pj value of 1UI@ 1 MHZ. In operation 206, an input bit stream is read from the DUT 130 and the initial Pj value is applied. In operation 207 (FIG. 2B), the jitter pattern is transferred to the signal generator 110 and, in operation 208, an EYE open value or set of values is measured by creating an EYE contour in the oscilloscope software. In operation 209 the oscilloscope software determines if the eye measurement satisfies the jitter test criteria. For example, the criteria may be satisfied if the eye Open<(Mask width+10%) AND>(Actual Mask width−10%) AND EYE Masj hits<waiver limit (for example 50 hits). Of course, other criteria are also possible. If the measurement satisfies the criteria, the jitter values are calibrated beginning with operation 210 (FIG. 2C). In operation 210, an additional mask is created in the oscilloscope software which overlaps and sits at a top portion of the center mask. This additional mask helps to determine whether the Eye Height determination is met, since the oscilloscope software provides mask hits for any overlapping segment. In operation 211, if the overlap mask segment fails, the swing gain of the signal generator is increased by a factor in operation 212, otherwise the swing adjustment is complete as determined in operation 213. Next the signal generator pattern is saved in the memory 112 with the calibrated pattern in operation 214.

Returning back to operation 209 (FIG. 2B), if instead the eye measurement does not satisfy the jitter test criteria, then the inserted jitter is adjusted. The decision block 215 determines which way the jitter is to be adjusted. For example the decision block 215 may apply the criterion of "if eye open<Mask width−10% OR EYE MASK hits." Other criteria may also be used. If jitter is to be reduced, it is reduced in operation 216. Otherwise, if jitter is to be added, it is added in operation 217. Then, referring back to FIG. 2A, the flow returns back to operation 206, the input bit stream is again read and a new Pj value applied.

The method for calibration of jitter described above achieves a target value within range. Embodiments of the present invention provide a non-linear equation to achieve a closed loop calibration. The convergence happens in a damping fashion.

Figure 3:
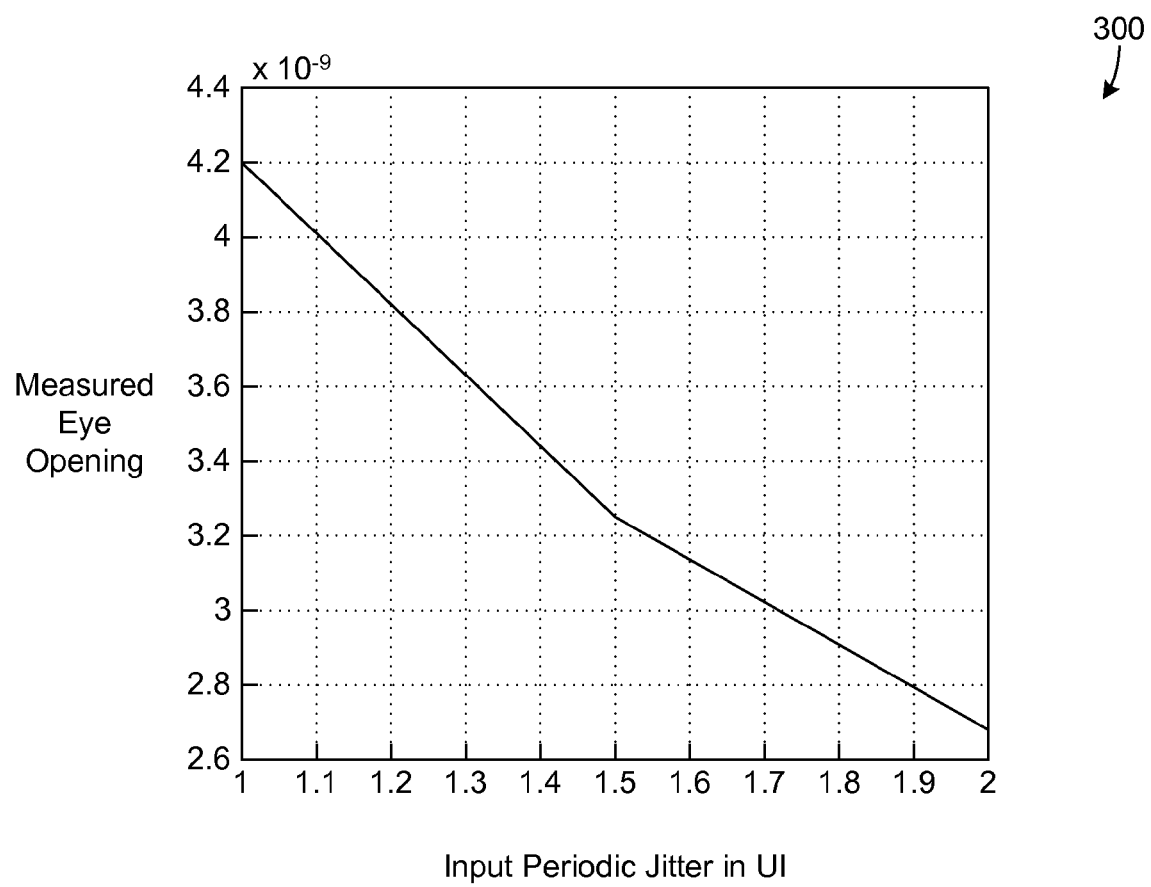
FIG. 3 is a chart illustrating periodic jitter of the system using poly-fit estimation in accordance with embodiments of the invention.

Returning back to operation 203, the 3-point calibration means to generate and measure three swing values for a pattern loaded in the signal generator, and generate and measure 3 jitter values by loading the pattern into the signal generator. In some embodiments the 3 values for swing may include 1.0V, 750 mV and 500 mV, for example. For periodic jitter, the 3 values may include 1.0UI, 1.5UI and 2.0UI. These values are configurable. Also in operation 203, the polynomial fit of order 2 is performed and the value of interest for the target value is estimated. This estimated jitter value will be called as m_initialPj. The system response 300 for the periodic jitter value is as shown in FIG. 3.

The estimated swing value is used to calibrate the jitter value. First the swing value is initially calibrated since jitter is added to the bit stream, the slope of the bits becomes slow and eye opening reduces. So, if swing keeps varying, then more jitter can be added, which gets to a marginal eye at higher jitter numbers. So, the swing calibration is completed first and then jitter calibration steps are performed.

In an example, the target Eye Width (TEW) is 3.3 ns, which is the center mask value. The range is +/−5% which means the calibrated jitter value should lie between 3.3 ns−0.05*(3.3 ns) and 3.3 ns+0.05*(3.3 ns).

In an embodiment, the Closed Loop calibration logic implements a custom nonlinear equation:

First, the eye width is measured in the operation 208 (FIG. 2B) after the initial insertion of Pj 1UI value. For example, assume the measured Eye Width (MEW) is 5 ns. Next a time value is determined by evaluating how far the measured MEW is from TEW. In this example, MEW−TEW=5 ns−3.5 ns, or 1.5 ns.

Then a 'how_far_value' is normalized with the target value which gives 1.5 ns/3.5 ns=0.4286. This value becomes incr_Pj, and is used as the incremental Pj value for next iteration.

The next iteration value is m_initialPj=m_initialPj+incr_Pj which is 1UI+0.4286=1.4286.

As observed above, the increment incr_Pj is positive which means more jitter can be added in operation 217.

If instead, for example, the MEW is 2.5 ns, which is below target value of 3.3 ns, the 'how_far_value' is computed as =MEW−TEW=2.5 ns−3.3 ns=−0.8 ns. Then normalizing 'how far value' gives −0.8 ns/3.5 ns=−0.226.

Adding the −0.226 to the initial jitter value m_initialPj of 1.0 reduces the jitter insertion value in the operation 216.

As observed above, the increment is negative which means jitter addition has to be reduced to meet the eye margins. So, the automatically incremented or reduced amount of jitter happens as part of the closed loop calibration. The operations 206-217 are repeated until the measured eye width is within the specified range. The calibration logic of the calibrator 140 (FIG. 1) is a hybrid model with a combination of polynomial and closed loop methods as described above.

Figure 4:
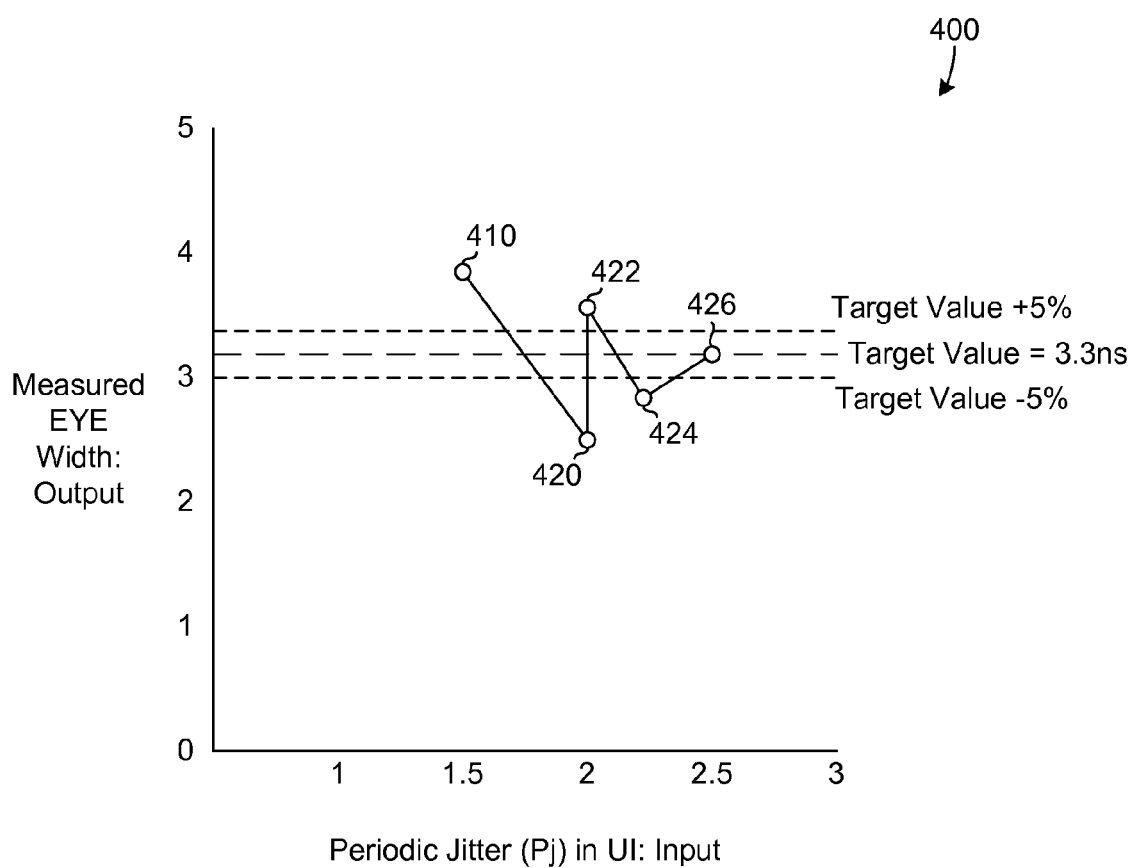
FIG. 4 is a graph illustrating calibration convergence in accordance with embodiments of the invention.

Referring to FIG. 4, convergence graph 400 illustrates an example calibration flow in accordance with an embodiment of the invention. First a second-order polynomial fit is performed with the result illustrated as 410. Then the closed-loop values are calibrated in multiple iterations until the measured eye width output falls within 5% of the target value of 3.3 ns, as illustrated in 420-426.

The technique used for accurate signal generation (with calibration) includes two main steps:

Step 1: Characterization—Each parameter is varied across an appropriate range, and a poly-fit is obtained to characterize the measured values.

Step 2: Fine-Tuning—A validation test is run with the estimated values from the characterization step. If the measured values are within the accuracy desired, there are no further steps required. If not, then a further iterative algorithm is applied to converge on the desired values within the desired accuracy. This step uses the estimates from the first step, and fine-tunes those using modifications of the derivative-based optimization operation.

The above two steps enables the calibration of the backward data patterns, such as eCBUS BWD data patterns by adjusting jitter based on jitter with DUT Tx Clock.

Figure 5:
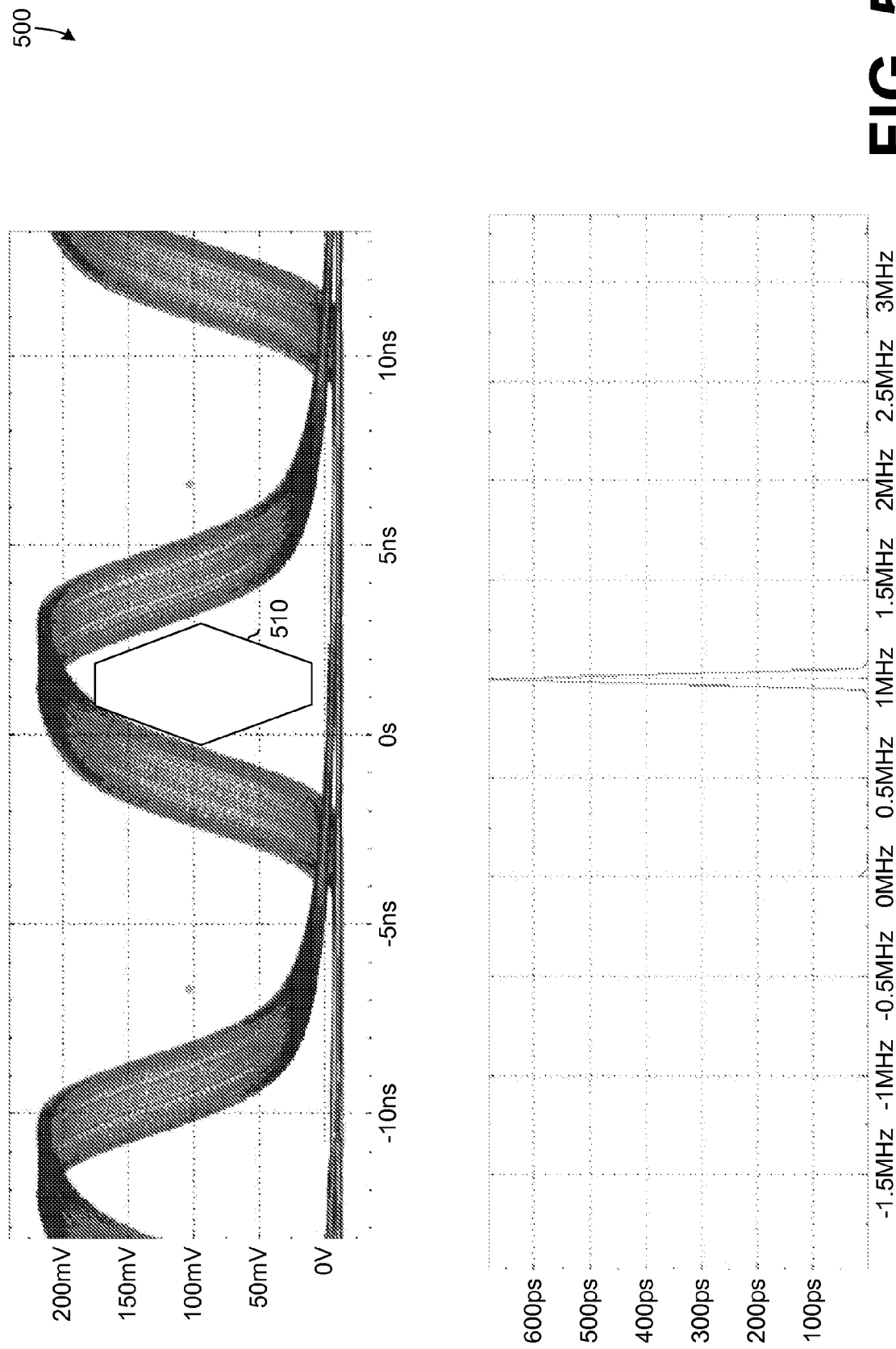
FIG. 5 shows calibrated results after dynamic calibration with Marginal EYE, EYE diagram and Spectrum showing Periodic jitter values for 1 MHz in accordance with an embodiment of the invention.
Figure 6:
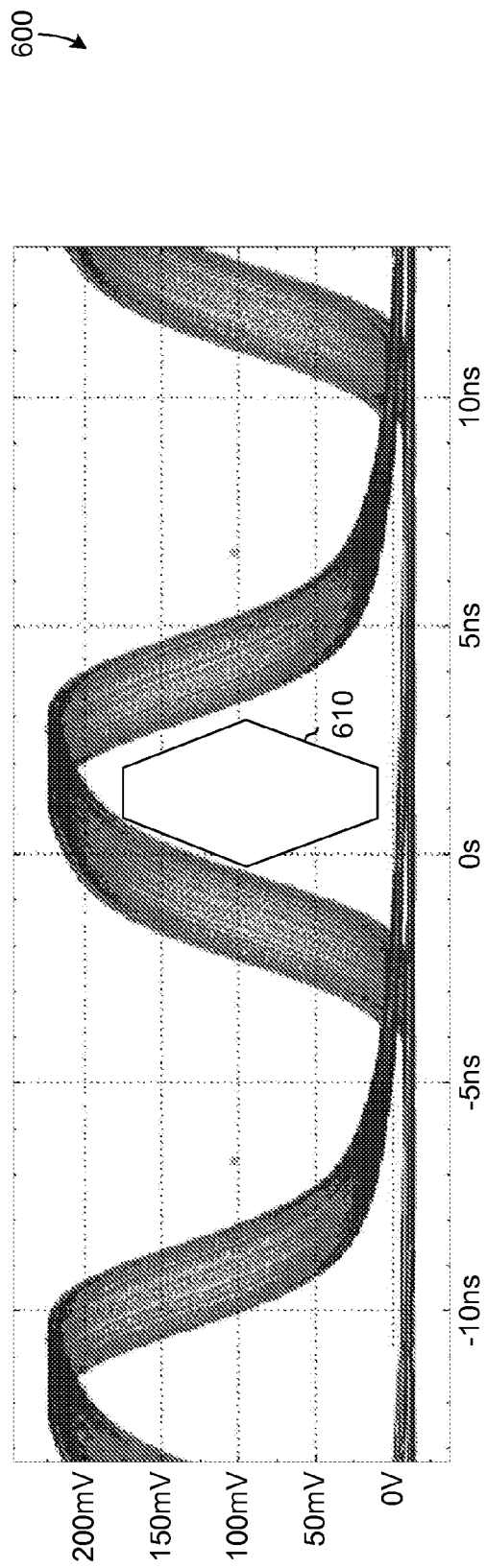
FIG. 6 shows calibrated results after dynamic calibration with Marginal EYE, EYE diagram and Spectrum showing Periodic jitter values for 500 kHz in accordance with an embodiment of the invention.
Figure 6:
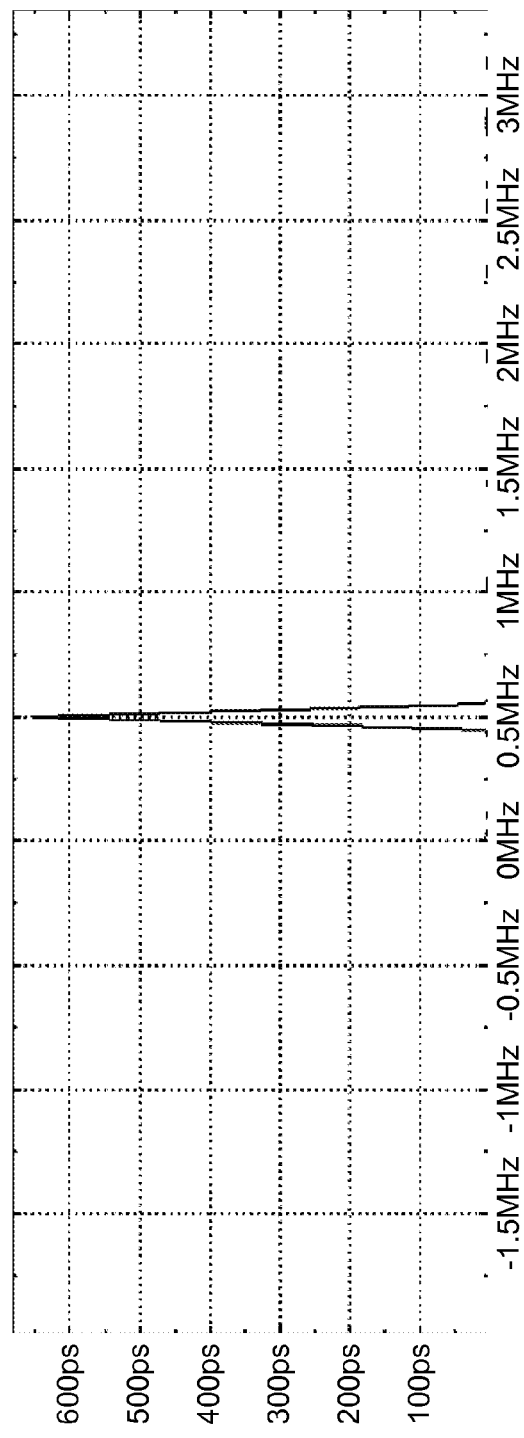

Referring to FIGS. 5 and 6, the final calibrated results after performing dynamic calibration with Marginal EYE, EYE diagram and Spectrum showing periodic jitter value 510 for 1 MHz (FIG. 5) and periodic jitter value 610 for 500 kHz (FIG. 6) components is shown in accordance with an embodiment of the invention.

In an advantageous aspect, embodiments of the invention work in conjunction with a Real-time (RT) oscilloscope, and provides a facility to interface with a signal generator to controls the sequence of target impairments.

Further, embodiments of the present invention lets users automatically calibrate pattern required by the particular specifications, such as the CTS specification, and lets the user specify a set of patterns to be calibrated. When each test is run, the calibration results are automatically applied based on the pattern type.

It shall be well understood to a person skilled in the art that the invention is not limited to any particular standard, but is applicable to systems having similar architecture without depraving from the inventive scope.

The foregoing description has been described for purposes of clarity and understanding. In view of the wide variety of permutations to the embodiments described herein, the description is intended to be illustrative only, and should not be taken as limiting the scope of the invention. Although specific embodiments of the invention have been illustrated and described for purposes of illustration, various modifications may be made without departing from the spirit and scope of the invention. Accordingly, the invention should not be limited except as by the appended claims.

What is claimed is:

1. A system for dynamically calibrating data patterns for a Device Under Test (DUT), the system comprising:

a signal generator structured to generate a data pattern;
a DUT structured to generate a clock signal;
an oscilloscope coupled to the signal generator and to the DUT and structured to measure margins of the generated clock signal compared to an eye-diagram produced on the oscilloscope from the data pattern; and
a calibration unit coupled to the signal generator and to the oscilloscope, the calibration unit structured to produce a candidate jitter value for the signal generator, and to receive a determination from the oscilloscope whether the data pattern generated with the candidate jitter value causes the DUT to produce the generated clock signal within a pre-determined tolerance level from a measured eye width of the eye-diagram generated by the oscilloscope from the data pattern.

2. The system according to claim 1, in which the calibration unit is further structured to generate a candidate voltage swing value, send the candidate voltage swing value to the signal generator, and receive a determination from the oscilloscope whether the candidate voltage swing value causes the DUT to produce the generated clock signal within the pre-determined tolerance level from the measured eye width of the eye-diagram generated by the oscilloscope from the data pattern.

3. The system according to claim 1, further comprising: a memory coupled to the signal generator and structured to store calibrated patterns, wherein the calibrated patterns include data patterns that cause the DUT to produce generated clock signals within the pre-determined tolerance level from the measured eye width.

4. The system according to claim 1 in which the signal generator comprises a phase locked loop structured to accept a clock signal related to the clock signal of the DUT and to generate the data pattern aligned to the accepted clock signal.

5. The system according to claim 1 in which the candidate jitter value is produced through an iterative process.

6. The system according to claim 5 in which a final candidate jitter value comprises an initial candidate jitter value adjusted by a normalized jitter value factor.

7. A method of dynamically calibrating data patterns for a Device Under Test (DUT) the method comprising:
generating a candidate jitter value;
providing the candidate jitter value to a signal generator to cause the signal generator to generate a candidate data pattern, based on the candidate jitter value, for input to the DUT; and
receiving from an oscilloscope a determination whether the candidate data pattern causes the DUT to produce a clock signal that is within a pre-determined tolerance level from a measured eye width of an eye-diagram generated by the oscilloscope from the candidate data pattern.

8. The method of claim 7, further comprising:
generating a candidate voltage swing value;
sending the candidate voltage swing value to the signal generator; and
receiving from the oscilloscope a determination of whether the candidate voltage swing value causes the DUT to produce the generated clock signal within the pre-determined tolerance level for a measured eye height of the eye-diagram generated by the oscilloscope from the candidate data pattern.

9. The method of claim 7 further comprising storing one or more calibrated patterns in a memory associated with the signal generator, wherein the one or more calibrated patterns include candidate data patterns that cause the DUT to produce generated clock signals within the pre-determined tolerance level from the measured eye width.

10. The method of claim 9, wherein the candidate data pattern based on a clock signal of the DUT that is divided to reduce an output range of the clock signal to match an input range of the signal generator.

11. The method of claim 7, wherein the candidate jitter value is a current candidate jitter value, the method further comprising generating the current candidate jitter value iteratively based on a previous candidate jitter value.

12. The method of claim 11, further comprising normalizing the previous candidate jitter value to produce the current candidate jitter value.

13. One or more non-transitory computer-readable media having instructions embodied thereon, which, when executed by a computing device, provide the computing device with a calibration unit for dynamically calibrating data patterns, the calibration unit configured to:
produce a candidate jitter value;
output, to a signal generator, the candidate jitter value to cause the signal generator to generate a candidate data pattern, based on the candidate jitter value, that is to be provided to a device under test (DUT);
receive a determination, from an oscilloscope, that the candidate data pattern causes the DUT to produce a clock signal within a pre-determined tolerance level; and
based on the determination, cause the candidate data pattern to be stored in a memory associated with the signal generator as a calibrated data pattern.

14. The one or more non-transitory computer-readable media of claim 13, wherein the calibration unit is further configured to automatically adjust the candidate jitter value until receipt of the determination that the candidate data pattern causes the DUT to produce a clock signal within the pre-determined tolerance level.

15. The one or more non-transitory computer-readable media of claim 14, wherein to automatically adjust the candidate jitter value is an iterative process, such that at each iteration the candidate jitter value is based on a previous candidate jitter value.

16. The one or more non-transitory computer-readable media of claim 15, wherein an initial candidate jitter value for the iterative process is determined utilizing a 3-point calibration technique.

17. The one or more non-transitory computer-readable media of claim 13, wherein the pre-determined tolerance level is based on a measured eye width of an eye-diagram generated by the oscilloscope from the candidate data pattern.

18. The one or more non-transitory computer-readable media of claim 17, wherein the pre-determined tolerance level is based on the measured eye width as compared with a target eye width.

19. The one or more non-transitory computer-readable media of claim 18, wherein the calibration unit is further configured to:
produce a candidate voltage swing value, in response to receipt of the determination that the candidate data pattern causes the DUT to produce a clock signal within a pre-determined tolerance level;
output the candidate voltage swing value to the signal generator, wherein an amplitude of the candidate data pattern is based on the candidate voltage swing value; and
receive an indication, from the oscilloscope, that the candidate data pattern causes the clock signal produced by the DUT to achieve a target eye height, wherein to cause the candidate data pattern to be stored in the memory associated with the signal generator as the calibrated data pattern is further based on the indication.

20. The one or more non-transitory computer-readable media of claim 19, wherein the calibration unit is further configured to automatically adjust the candidate voltage swing value until receipt of the indication.

\* \* \* \* \*